_[19]_ United States Patent
Wu

[11] Patent Number: 6,083,793
[45] Date of Patent: Jul. 4, 2000

[54] METHOD TO MANUFACTURE NONVOLATILE MEMORIES WITH A TRENCH-PILLAR CELL STRUCTURE FOR HIGH CAPACITIVE COUPLING RATIO

[75] Inventor: Shye-Lin Wu, Hsinchu, Taiwan

[73] Assignee: Texas Instruments - Acer Incorporated, Hsinchu, Taiwan

[21] Appl. No.: 09/032,008

[22] Filed: Feb. 27, 1998

[51] Int. Cl.[7] .................................................. H01L 21/336
[52] U.S. Cl. ........................ 438/270; 438/443; 257/315; 257/330
[58] Field of Search .................................. 438/257, 258, 438/259, 262, 270, 786, 264; 257/315, 321

[56] References Cited

U.S. PATENT DOCUMENTS

| | | | |
|---|---|---|---|
| 4,914,058 | 4/1990 | Blanchard | 438/270 |
| 5,705,415 | 1/1998 | Orlowski et al. | 438/259 |
| 5,837,583 | 11/1998 | Chuang et al. | 438/257 |
| 5,840,607 | 11/1998 | Yeh et al. | 438/257 |
| 5,861,347 | 1/1999 | Maiti et al. | 438/787 |

OTHER PUBLICATIONS

M. Gill et al., A Novel Sublithographic Tunnel Diode Based 5V–Only Flash Memory, 1990 IEEE, pp. 119–122.
B.J. Woo et al., A Novel Memory Cell Using Flash Array Contactless Eprom (Face) Technology, 1990 IEEE, pp. 91–94.
Yosiaki S. Hisamune et al., A High Capacitive–Coupling Ratio (HiCR) Cell for 3 V–Only 64 Mbit and Future Flash Memories, 1993 IEEE, pp. 19–22.
H. Shirai et al., A 0.54$\mu m^2$ Self–Aligned, HSG Floating Gate Cell (SAHF Cell) for 256Mbit Flash Memories, 1995 IEEE, pp. 653–656.

*Primary Examiner*—Wael Fahmy
*Assistant Examiner*—William David Coleman
*Attorney, Agent, or Firm*—Harness, Dickey & Pierce, P.L.C.

[57] ABSTRACT

A method to fabricate nonvolatile memories with a trench-pillar cell structure is disclosed. A pad oxide is formed on a substrate. A pad nitride is then formed on the pad oxide. An ion implantation is performed to form a lightly doping drain (LDD) in the substrate. The pad nitride, the pad oxide and the substrate are etched to form a trench. A nitride layer is then formed on the pad nitride to fill into the trench. The nitride layer is etched back to form spacers on the sidewalls of the trench. The substrate is etched back to form a subtrench in the trench. Afterward, a polysilicon layer is deposited to refill the trench region and covers a surface of the nitride. The polysilicon is etched back to remove the polysilicon layer on a surface of the nitride. The pad nitride, the nitride and the pad oxide are removed. A tunnel oxide is formed on the pillar, the trench region and the substrate. A floating gate is then formed. The floating is in the trench region and is extended to the top of the trench. An inter-poly oxide is formed on the floating gate. A control gate is formed on the inter-poly oxide. Spacers of the floating gate, the inter-poly oxide and the control gate are formed. Source/drain regions are formed in the substrate. A thick oxide is deposited on the surface of the substrate. A metal contact is formed on the source/drain region.

11 Claims, 4 Drawing Sheets

METHOD TO MANUFACTURE NONVOLATILE MEMORIES WITH A TRENCH-PILLAR CELL STRUCTURE FOR HIGH CAPACITIVE COUPLING RATIO

FIELD OF THE INVENTION

The present invention relates to a structure of the nonvolatile memories in integrated circuits, and more specifically, to a structure of nonvolatile memories with a trench-pillar cell structure.

BACKGROUND OF THE INVENTION

The non-volatile memories comprise electrically programmable read only memory (EPROM), electrically erasable programmable read only memory (EEPROM), flash EEPROM, non-volatile static random access memory (NVSRAM) and non-volatile dynamic random access memory (NVDRAM). Every non-volatile memory has its application. For example, the ERAMs with low density (less than 8 K) are used as a consumer radio tuner of a radio or an automotive engine controller. The EEPROMs with middle density is used as changeable softable storage. Thus, these memories have high speed and high reliability memories.

Flash memory has evolved as a low cost alternative to full feature EEPROM, and a more flexible alternative to UV-EPROM, with potential application in the automotive industry (e.g., an electronic engine control), consumer electronics (e.g., a copy machine), data acquisition systems, smart cards, telecommunications, solid state disks, embedded memories, etc. In IEDM Tech. Dig. page 119 on 1990, M. Gill et al. described that a novel tunnel diode was developed for high-density 5V-only flash memories. A low-power memory was proposed in this paper and it developed incorporating this tunnel diode as having excellent operation and reliability characteristics.

EPROMs use channel hot electron injection for byte-programming, and apply ultraviolet light exposure for erasing. EEPROMs employ Fowler-Nordheim (F-N) tunneling for both electrical programming and erasing. Due to the small cell size and simple cell design/process, EPROMs can be produced with higher density and lower cost when compared to EEPROM. On the other hand, EEPROMs offer the capability of byte-erase as well as the convenience of in-system electrical erasability. Recently, the flash memory has gained significant attention as it promises to combine the advantages of EPROM density with EEPROM electrical erasability. In IEDM Tech. Dig., 1990, page 91, B. J. Woo et al. described a flash array contactless EPROM (FACE) technology which can reduce planar areas of the EPROM without further stretching the device limits. Some disadvantages of the prior art for deep-submicron generation were described in this paper. For deep-submicron (<0.5 micron meters) generation, contact printing, definition and associated contact filling, barrier metal and planarization techniques become more complicated. Thus, the FACE technology is used in the manufacture of nonvolatile memories.

The manufacture of EEPROM is to form active regions of the device, a tunnel oxide, a floating gate on the tunnel oxide, an inter-poly oxide on the floating gate and then a controlling gate on the inter-poly oxide. A coupling-ratio characteristic of EEPROM influences the operation of the device. A flash memory with high coupling ratio can be erased or programmed using low power. On page 19 of IEDM Tech. Dig., 1993, Y. S. Hisamune et al. described a high capacitive-coupling ratio (HiCR) cell for future flash memory. The HiCR cell is designed to have an ultra-small tunneling region and a large floating-gate area in order to obtain the high capacitive-coupling ratio of 0.8. The tunneling region has an area of about 0.2 $\mu$m×0.4 $\mu$m and the floating-gate region has an area of about 1.4 $\mu$m×0.4 $\mu$m. The coupling ratio is about 0.8. The cell performance is acceptable for actual device operation in a 3 V power supply.

On page 653 of IEDM Tech. Dig., 1995, H. Shirai et al. disclosed the manufacture of flash memories with a hemispherical grain (HSG) floating gate. The authors of this paper tried to increase the coupling ratio of the flash memory in order to operate the devices by using low power. Not only is the coupling ratio increased, but also few process steps are used in the manufacture of the flash memories. Thus, this simple cell structure promises a low cost 256 Mbit flash memory that works at only 3 V in the paper. Applying HSG poly-Si to the floating gate extends the upper surface area doubling that of the floating gate in comparison with the conventional ones in the paper.

According to the above discussions, increasing a coupling ratio of flash memories and reducing process steps of the devices are an important topics. Many people have tried to solve the problems.

SUMMARY OF THE INVENTION

A pad oxide is deposited on a p-type substrate. A pad nitride is then deposited on the pad oxide. An N lightly doping drain is formed in the substrate by using ion implantation. The ion is Arsenic ion or Phosphorus ion.

A photoresist layer is applied onto the pad nitride to define a trench region on the substrate. A dry etching is performed to form a trench in the substrate. A nitride layer is then deposited and the trench is refilled. The nitride layer is etched back and spacers of the trench are formed. The substrate is etched to form a subtrench.

A polysilicon layer is deposited to refill the trench region. The polysilicon layer is etched back to form a plug of the trench region. The polysilicon plug is inserted into the subtrench. The nitride layer and the pad oxide are removed. A tunnel oxide is growm on the surface.

A floating gate, an inter-poly oxide and a control gate are formed by using conventional techniques. Spacers of the gates are formed and the spacers consist of silicon dioxide. Active regions of the cell are formed in the substrate by using ion implantation. Finally, a thick chemical vapor deposition oxide is conformal deposited. A metal contact is formed on the active region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method to increase the coupling ratio of nonvolatile memory is disclosed in the present invention. A preferred embodiment is used to describe the invention.

Figure 1:
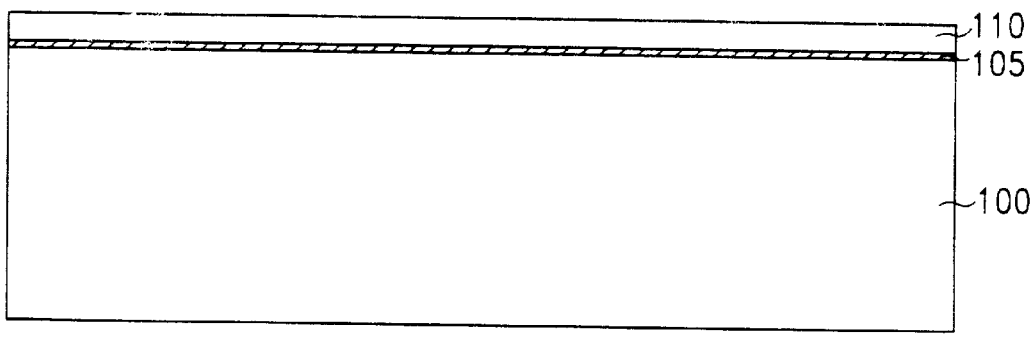
FIG. 1 is a cross-sectional view of a semiconductor substrate illustrating the formation of a pad oxide and a pad silicon nitride on the substrate in accordance with the present invention.

Referring to FIG. 1, a single crystal P-type substrate 100 with a <100> crystallographic orientation is used for the preferred embodiment. A pad oxide 105 is formed on the substrate 100 by using thermal oxidation. The pad oxide 105 has a thickness of about 50 to 300 angstroms. Then, a silicon nitride 110 is deposited on the pad oxide 105 by using conventional chemical vapor deposition (CVD) system.

Figure 2:
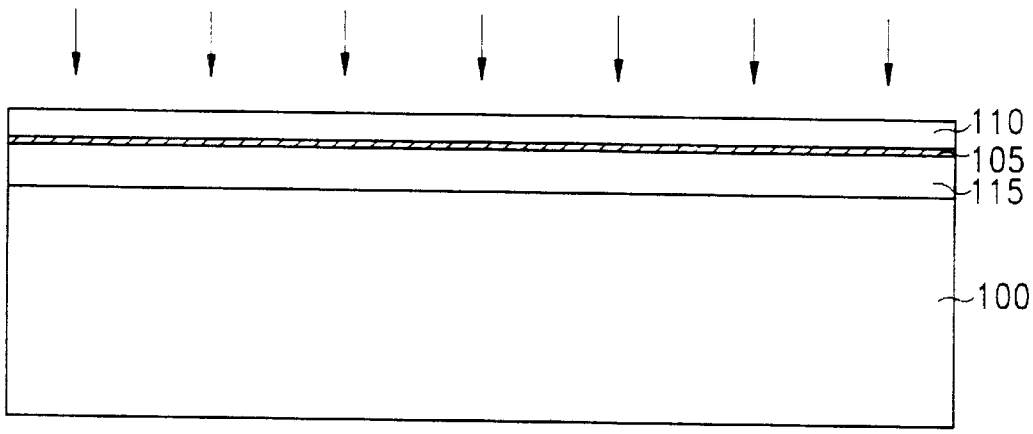
FIG. 2 is a cross-sectional view of a semiconductor substrate illustrating a blanket implantation to form a N lightly doping drain (N LDD) of the substrate in accordance with the present invention.

Referring to FIG. 2, an ion implant is performed on the substrate 100 and a $N^-$ lightly doping drain (N-LDD) is formed in the substrate 100. In the preferred embodiment, the implantation ion of the N-LDD is Phosphorus ion or Arsenic ion and the dosage of the implantation is about $5 \times 10^{12}$ to $5 \times 10^{14}$ ions/cm$^2$.

Figure 3:
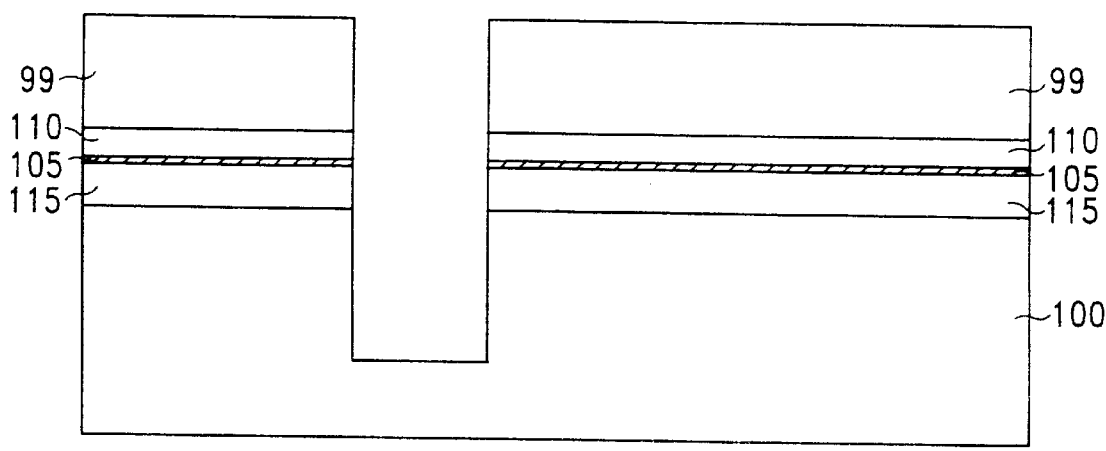
FIG. 3 is a cross-sectional view of a semiconductor substrate illustrating the definition of a cell region to form a deep trench in the substrate in accordance with the present invention.

Referring to FIG. 3, a photoresist layer 99 is applied onto the surface of the silicon nitride 110 and a trench region is defined. Then, a dry etching is performed to etch silicon nitride 110, pad oxide 105 and substrate 100. A trench is formed in the substrate 100. In the following steps, a pillar is formed in the trench and a tunnel oxide is formed on the pillar to increase the coupling ratio of nonvolatile memories. The photoresist 99 is stripped off after the dry etching of the trench.

Figure 4:
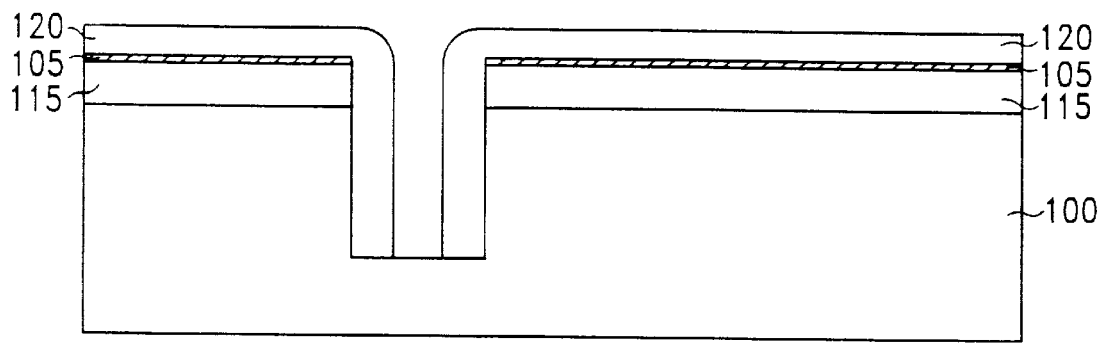
FIG. 4 is a cross-sectional view of a semiconductor substrate illustrating a silicon nitride layer deposited on a surface of the pad nitride and etched back to form a nitride spacer in the trench in accordance with the present invention.

Referring to FIG. 4, a silicon nitride 120 is deposited by using conventional chemical vapor deposition (CVD). The deposition of the silicon nitride 120 is followed by an anisotropic etching and the silicon nitride 120 on the bottom of the trench is removed. The silicon nitride 120 is covered on the pad oxide 105 and forms spacers of the trench.

Figure 5:
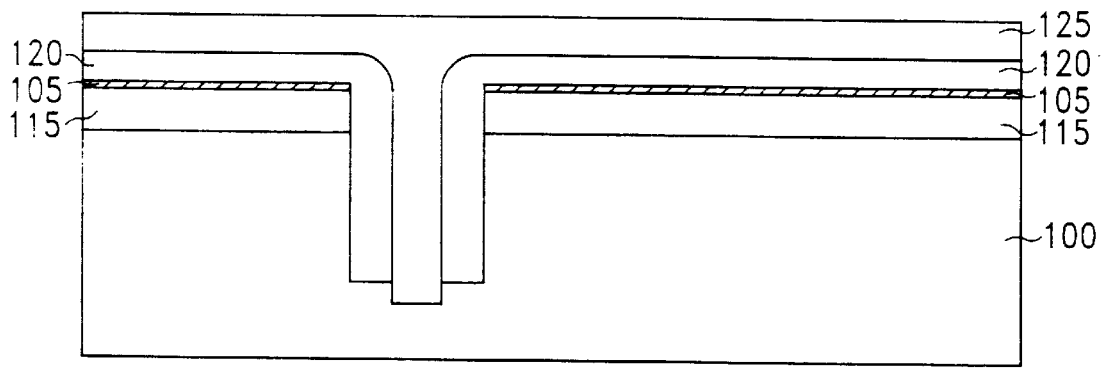
FIG. 5 is a cross-sectional view of a semiconductor substrate illustrating the formation of a sub-trench in the trench and the deposition of a polysilicon layer cover on the surface of the silicon nitride and the polysilicon layer filled into the trench in accordance with the present invention.

Referring to FIG. 5, an anisotropic etching is performed to etch the substrate 100 and a sub-trench is formed in the substrate 100. A polysilicon 125 is deposited by using low presure chemical vapor deposition (LPCVD). The polysilicon 125 is filled into the trench region and is extended to the surface of the silicon nitride 120. In the preferred embodiment, the polysilicon 125 is $N^+$ doped polysilicon.

Figure 6:
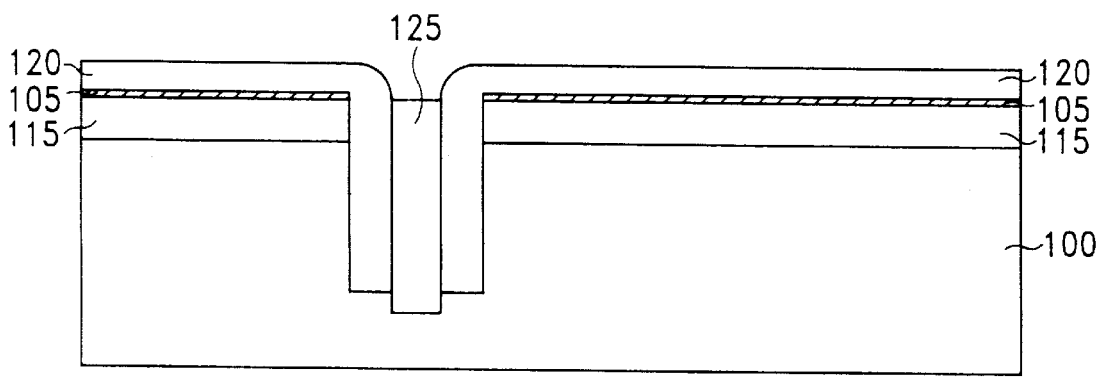
FIG. 6 is a cross-sectional view of a semiconductor substrate illustrating the formation of a polysilicon plug in the trench in accordance with the present invention.

Referring to FIG. 6, the polysilicon 125 on the silicon nitride is removed and a trench-pillar is formed in the trench region. In the preferred embodiment, a technique to etch back the polysilicon 125 is dry etching and/or a chemical mechanical polishing (CMP) process.

Figure 7:
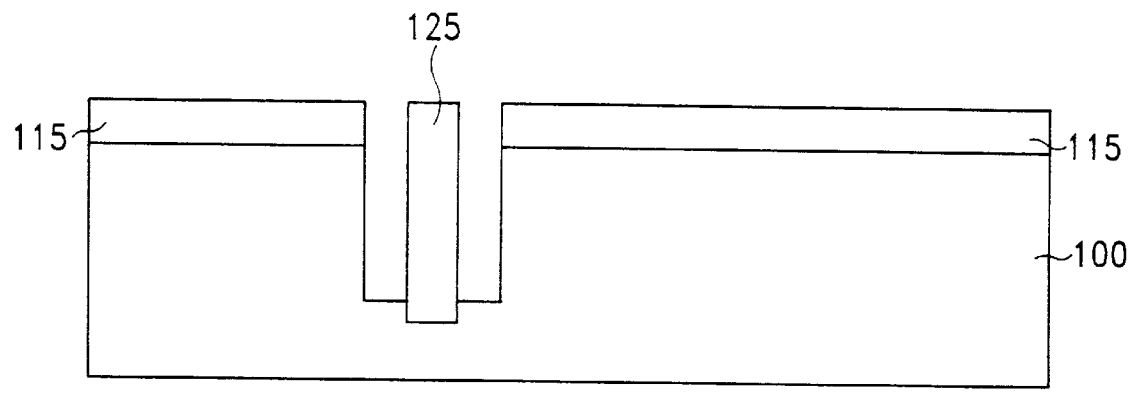
FIG. 7 is a cross-sectional view of a semiconductor substrate illustrating the removal of all nitride films and pad oxide films in accordance with the present invention.

Referring to FIG. 7, the silicon nitride 120 is stripped off by using hot phosphorus acid solution ($H_3PO_4$). The polysilicon 125 becomes a pillar of the trench and the pillar is inserted into the subtrench. The purpose for the subtrench is to stabilize the pillar and to form a strong structure. The pad oxide 105 is then removed by using wet etching. In the preferred embodiment, a chemical solution of the wet etching is buffer oxide etching (BOE) or HF solution.

Figure 8:
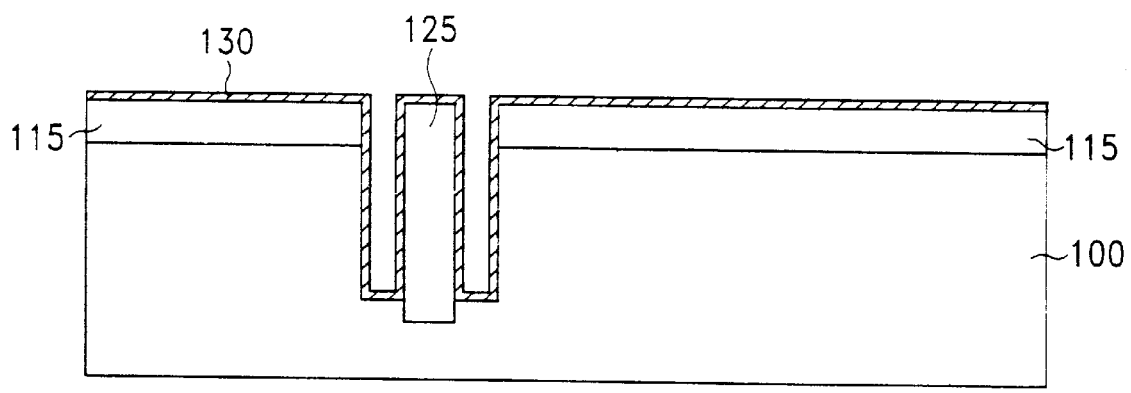
FIG. 8 is a cross-sectional view of a semiconductor substrate illustrating the formation of a tunnel oxide in accordance with the present invention.

Referring to FIG. 8, after the removal of the pad oxide 105, a tunnel oxide 130 is grown and covers all of the surface. The growing method of the tunnel oxide 130 is thermal oxidation to form silicon oxide and ambient reactants of the oxidation are chosen from the group of dry oxygen. $N_2O$ gas and NO gas are preferred. The tunnel oxide can be deposited using conventional chemical vapor deposition and is oxynitride. The deposition of oxynitride is followed by a thermal annealing. The thermal annealing has a temperature of about 800° C. to 1100° C. The tunnel oxide 130 is thin and has a thickness of about 30 to 150 angstroms in the preferred embodiment.

Figure 9:
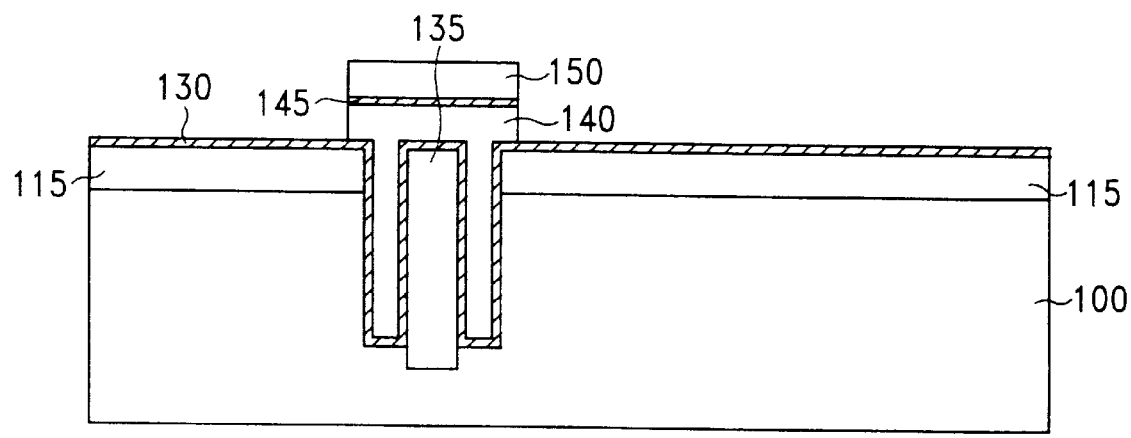
FIG. 9 is a cross-sectional view of a semiconductor substrate illustrating the formation of a floating gate, an inter-poly oxide layer and a control gate in accordance with the present invention.

Referring to FIG. 9, a floating gate 140, an inter-poly oxide 145 and a control gate 150 are formed. The floating gate 140 includes polysilicon. The floating gate 140 is in the trench region and extends to the top of the trench. The inter-poly oxide 145 is then formed on the floating gate 140 and includes silicon oxide. The inter-poly oxide 145 could be formed using low pressure chemical vapor deposition (LPCVD) or thermal oxidation processes of in the preferred embodiment. After the formation of the inter-poly oxide 145, a control gate 150 is formed on the inter-poly oxide. The control gate 150 is polysilicon and is formed using LPCVD system.

Figure 10:
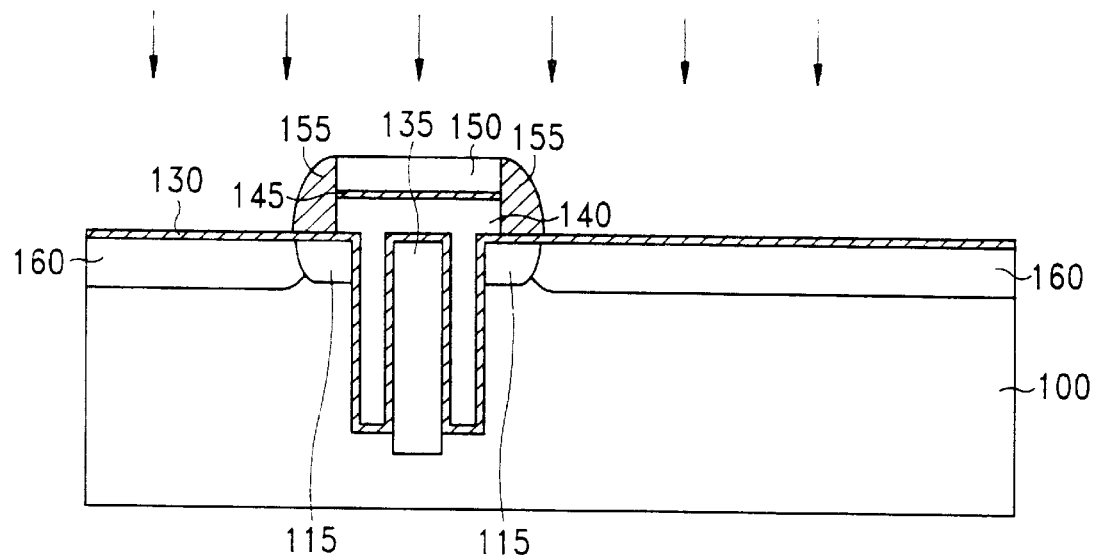
FIG. 10 is a cross-sectional view of a semiconductor substrate illustrating the formation of spacers of the gates and active region in the substrate.

Referring to FIG. 10, oxide spacers 155 of the gates are formed. The purpose of forming oxide spacers 155 is to insulate the gates. After formation of the oxide spacers 155, an ion implantation is performed to form a source/drain region 160 in the substrate 100. The implantation is a heavy doping and the ion of the implantation is Arsenic or Phosphorus ion. In the preferred embodiment, the dosage of the implantation is about $2 \times 10^{14}$ to $5 \times 10^{16}$ ions/cm$^2$. The LDD regions of the memory cell are under the oxide spacers 155 and the source/drain region 160 is in the remaining surface of the substrate 100. Thus, the active regions of the memory cell are larger and the contact area between the active region and the tunnel oxide 130 is increased. Because the area of the tunnel oxide is increased and the inter-poly oxide 145 is small, the coupling ratio of the memory cell is increased.

Figure 11:
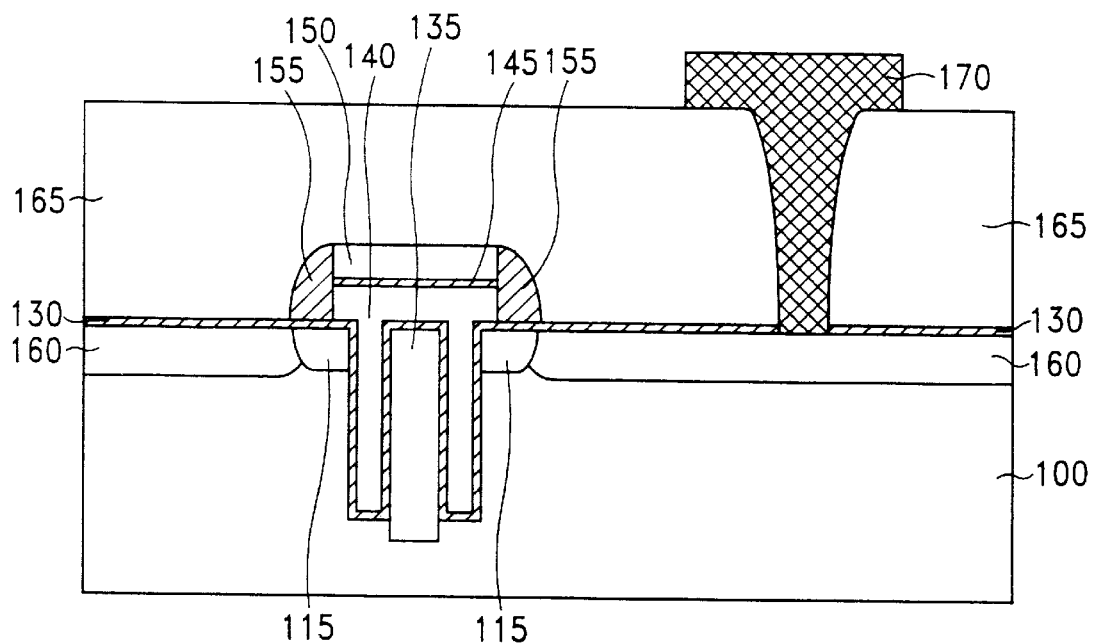
FIG. 11 is a cross-sectional view of a semiconductor substrate illustrating a thick oxide layer formed on the surface of the substrate and a metal contact formed in the thick oxide layer.

Referring to FIG. 11, a thick oxide 165 is deposited on the surface of the substrate 100. The oxide 165 is deposited using the conventional chemical vapor deposition (CVD) system. A contact hole is opened in the oxide 165 and is on the source/drain region 160 of the memory cell. Finally, a metal is formed to fill the contact hole and a metal contact 170 of the memory cell is formed.

Based on the above description, the present invention has two benefits. The first benefit is that a storage area of the nonvolatile memory could be significantly increased by using a trench-pillar cell structure. The second benefit is that the high capacitive-coupling ratio could be achieved for fast, low power operation.

As is understood by a person skilled in the art, the foregoing preferred embodiment of the present invention are illustrative of the present invention rather than limiting of the present invention.

While the preferred embodiment of the invention has been illustrated and described, it will be appreciated that various changes can be made therein without departing from the spirit and scope of the invention.

What is claimed is:

1. A method to fabricate nonvolatile memory, the method comprising the steps of:

forming a pad oxide on a substrate;

forming a pad nitride on said pad oxide;

forming a lightly doping drain (LDD) in said substrate;

etching back said pad nitride, said pad oxide and said substrate to form a trench;

forming a nitride layer on said pad nitride to fill into the trench;

etching back said nitride layer to form spacers on sidewalls of the trench;

etching back said substrate to form a subtrench in the trench;

depositing a polysilicon layer to refill said trench region and cover on a surface of said nitride layer;

etching back said polysilicon to remove said polysilicon layer on a surface of said nitride to form a pillar;

removing said pad nitride and said nitride;

removing said pad oxide;

forming a tunnel oxide to cover said pillar, said trench region and said substrate;

forming a floating gate that is in the trench region and is extended to the top of the trench;

forming an inter-poly oxide on said floating gate;

forming a control gate on said inter-poly oxide;

forming spacers of said floating gate said inter-poly oxide and said control gate;

forming source/drain regions in said substrate;

depositing an oxide on the surface of the substrate; and forming a metal contact on said source/drain region.

2. The method of claim 1, wherein said forming a lightly doping drain (LDD) in said substrate is to perform an ion implantation, using Phosphorus ion or Arsenic ion, at a dosage about $5 \times 10^{12}$ to $5 \times 10^{14}$ ions/cm$^2$.

3. The method of claim 1, wherein the step of etching back said polysilicon is dry etching or chemical mechanical polishing (CMP) process.

4. The method of claim 1, wherein the step of remove said pad oxide is done using a BOE (buffer oxide etching) solution or a HF solution.

5. The method of claim 1, further comprises following step to form said tunnel oxide:

depositing an oxynitride layer; and performing a thermal annealing.

6. The method of claim 1, wherein said tunnel oxide comprises silicon oxide.

7. The method of claim 1, wherein said forming source/drain regions in said substrate is an ion implantation, at a dosage of about $2 \times 10^{14}$ to $5 \times 10^{16}$ ions/cm$^2$.

8. A method to fabricate a pillar in a trench region, the method comprises the steps of:

forming a pad oxide on a substrate;

forming a pad nitride on said pad oxide;

forming a lightly doping drain (LDD) in said substrate;

etching back said pad nitride, said pad oxide and said substrate to form a trench;

forming a nitride layer on said pad nitride to fill into the trench;

etching back said nitride layer to form spacers on sidewalls of the trench;

etching back said substrate to form a subtrench in the trench;

depositing a polysilicon layer to refill said trench region and cover on a surface of said nitride layer;

etching back said polysilicon to form a pillar of the trench region;

removing said pad nitride and said nitride;

removing said pad oxide.

9. The method of claim 8, wherein said forming a lightly doping drain (LDD) in said substrate is to perform an ion implantation, using Phosphorus ion or Arsenic ion, at a dosage about $5 \times 10^{12}$ to $5 \times 10^{14}$ ions/cm$^2$.

10. The method of claim 8, wherein the step of etching back said polysilicon is dry etching or chemical mechanical polishing (CMP) process.

11. The method of claim 8, wherein the step of remove said pad oxide is done using a BOE (buffer oxide etching) solution or a HF solution.

* * * * *